US011355655B2

(12) United States Patent
Boyd et al.

(10) Patent No.: US 11,355,655 B2
(45) Date of Patent: *Jun. 7, 2022

(54) ENERGY HARVESTING METHODS FOR PROVIDING AUTONOMOUS ELECTRICAL POWER TO VEHICLES AND ELECTRICALLY-POWERED DEVICES IN VEHICLES

(71) Applicant: FACE INTERNATIONAL CORPORATION, Norfolk, VA (US)

(72) Inventors: Clark D. Boyd, Portsmouth, VA (US); Bradbury R Face, Smithfield, VA (US); Jeffrey D Shepard, Norco, CA (US)

(73) Assignee: FACE INTERNATIONAL CORPORATION, Norfolk, VA (US)

( * ) Notice: Subject to any disclaimer, the term of this patent is extended or adjusted under 35 U.S.C. 154(b) by 110 days.

This patent is subject to a terminal disclaimer.

(21) Appl. No.: 16/507,010

(22) Filed: Jul. 9, 2019

(65) Prior Publication Data

US 2019/0334039 A1    Oct. 31, 2019

Related U.S. Application Data

(63) Continuation-in-part of application No. 15/416,234, filed on Jan. 26, 2017, now Pat. No. 10,529,871,
(Continued)

(51) Int. Cl.
*H01L 31/0232* (2014.01)
*H01L 31/02* (2006.01)
(Continued)

(52) U.S. Cl.
CPC .......... *H01L 31/02327* (2013.01); *B60J 5/04* (2013.01); *B60L 8/003* (2013.01); *B62D 25/06* (2013.01);
(Continued)

(58) Field of Classification Search
CPC ............... H01L 31/048; H01L 31/0203; H01L 31/02427; H01L 31/0236; H01L 31/0392;
(Continued)

(56) References Cited

U.S. PATENT DOCUMENTS

| 5,604,626 A * | 2/1997 | Teowee ............. B32B 17/10036 359/265 |
| 5,807,440 A * | 9/1998 | Kubota ................. H01L 31/048 136/256 |

(Continued)

FOREIGN PATENT DOCUMENTS

EP     2093804 A1 *  8/2009  .......... H01L 31/048

*Primary Examiner* — Jeffrey T Carley
(74) *Attorney, Agent, or Firm* — Lowndes; Stephen C. Thomas

(57) ABSTRACT

A method is provided that integrates an autonomous energy harvesting capacity in vehicles in an aesthetically neutral manner. A unique set of structural features combine to implement a hidden energy harvesting system on a surface of the vehicle to provide electrical power to the vehicle, and/or to electrically-powered devices in the vehicle. Color-matched, image-matched and/or texture-matched optical layers are formed over energy harvesting components, including photovoltaic energy collecting components. Optical layers are tuned to scatter selectable wavelengths of electromagnetic energy back in an incident direction while allowing remaining wavelengths of electromagnetic energy to pass through the layers to the energy collecting components below. The layers uniquely implement optical light scattering techniques to make the layers appear opaque when observed from a light incident side, while allowing at least 50%, and as much as 80+%, of the energy impinging on the energy or incident side to pass through the layer.

20 Claims, 7 Drawing Sheets

Related U.S. Application Data which is a continuation of application No. 15/416,259, filed on Jan. 26, 2017, now Pat. No. 10,347,777.

(51) Int. Cl.

| | | |
|---|---|---|
| *B62D 25/12* | (2006.01) | |
| *B60L 8/00* | (2006.01) | |
| *H02S 99/00* | (2014.01) | |
| *H01L 31/0236* | (2006.01) | |
| *H02S 40/34* | (2014.01) | |
| *B60J 5/04* | (2006.01) | |
| *H01L 31/0203* | (2014.01) | |
| *B62D 25/06* | (2006.01) | |
| *H02S 40/22* | (2014.01) | |
| *H01L 31/048* | (2014.01) | |
| *H01L 31/0392* | (2006.01) | |
| *H01L 31/0216* | (2014.01) | |
| *B62D 33/02* | (2006.01) | |

(52) U.S. Cl.
CPC ............ *B62D 25/12* (2013.01); *B62D 33/02* (2013.01); *H01L 31/02* (2013.01); *H01L 31/0203* (2013.01); *H01L 31/0236* (2013.01); *H01L 31/02168* (2013.01); *H01L 31/0392* (2013.01); *H01L 31/048* (2013.01); *H02S 40/22* (2014.12); *H02S 40/34* (2014.12); *H02S 99/00* (2013.01); *Y02T 10/7072* (2013.01)

(58) Field of Classification Search
CPC ... H01L 31/02168; H02S 40/22; H02S 40/34; B62D 25/12; B62D 33/02; B60L 8/003
See application file for complete search history.

(56) References Cited

U.S. PATENT DOCUMENTS

| | | | | |
|---|---|---|---|---|
| 6,300,158 | B1* | 10/2001 | Simburger | H01L 31/048 438/59 |
| 8,319,093 | B2* | 11/2012 | Kalkanoglu | H01L 31/02 136/251 |
| 2002/0157702 | A1* | 10/2002 | Cordaro | H01L 31/18 136/256 |
| 2007/0028958 | A1* | 2/2007 | Retti | F02M 21/0296 136/244 |
| 2009/0000221 | A1* | 1/2009 | Jacobs | H02S 20/23 52/173.3 |
| 2009/0269579 | A1* | 10/2009 | Minaki | G02B 5/223 428/338 |
| 2010/0096006 | A1* | 4/2010 | Griffiths | H01L 31/0547 136/256 |
| 2011/0023937 | A1* | 2/2011 | Daniel | E04F 10/08 136/246 |
| 2011/0226312 | A1* | 9/2011 | Bohm | B32B 7/12 136/251 |

* cited by examiner

300

ENERGY HARVESTING METHODS FOR PROVIDING AUTONOMOUS ELECTRICAL POWER TO VEHICLES AND ELECTRICALLY-POWERED DEVICES IN VEHICLES

This non-provisional application for patent is a continuation of U.S. patent application Ser. No. 15/416,259, filed in the United States Patent and Trademark Office (USPTO) on Jan. 26, 2017, titled "ENERGY HARVESTING METHODS FOR PROVIDING AUTONOMOUS ELECTRICAL POWER TO VEHICLES AND ELECTRICALLY-POWERED DEVICES IN VEHICLES", which issued from the USPTO as U.S. Pat. No. 10,347,777 on Jul. 9, 2019, which is incorporated herein by reference in its entirety; this application is also a continuation-in-part (CIP) of U.S. patent application Ser. No. 15/416,234, entitled "Energy Harvesting Systems For Providing Autonomous Electrical Power To Vehicles And Electrically-Powered Devices In Vehicles," which was filed in the USPTO on Jan. 26, 2017 and which published as U.S. Patent Application Publication U.S. 2018-0212078 A1 on Jul. 26, 2018, the disclosure of which is hereby incorporated by reference herein in its entirety.

BACKGROUND

Field of the Disclosed Embodiments

This disclosure is directed to a unique method for forming a set of structural features on an outer surface of a body structure of a vehicle, the structural features combining to implement an aesthetically neutral, or aesthetically pleasing, energy harvesting system that provides autonomous electrical power to vehicles on which the system is installed, and/or to electrically-powered devices in those vehicles. Color-matched, image-matched and/or texture-matched optical layers, which provide an essentially same appearance from any viewing angle, and provide superior light transmission across the range of light impingement angles, are formed over energy harvesting components, including photovoltaic components.

Related Art

U.S. patent application Ser. No. 15/006,143 (the 143 application), which published as U.S. Patent Application Publication US 2016-0306078 A1 on Oct. 20, 2016, entitled "Systems and Methods for Producing Laminates, Layers and Coatings Including Elements for Scattering and Passing Selective Wavelengths of Electromagnetic Energy," and Ser. No. 15/006,145 (the 145 application), which published as U.S. Patent Application Publication US 2016-0306080 A1 on Oct. 20, 2016 entitled "Systems and Methods for Producing Objects Incorporating Selective Electromagnetic Energy Scattering Layers, Laminates and Coatings," each of which was filed on Jan. 26, 2016 and the disclosures of which are hereby incorporated by reference herein in their entirety, describe a structure for forming selectably energy transmissive layers and certain real world use cases in which those layers may be particularly advantageously employed.

The 143 and 145 applications note that, in recent years, the fields of energy harvesting and ambient energy collection have gained significantly increased interest. Photovoltaic (PV) cell layers and other photocell layers, including thin film PV-type (TFPV) material layers, are advantageously employed on outer surfaces of particular structures to convert ambient light to electricity.

Significant drawbacks to wider proliferation of photocells used in a number of potentially beneficial operating or employment scenarios are that the installations, in many instances, unacceptably adversely affect the aesthetics of the structure, object or host substrate surface on which the PV layers are mounted for use. PV layers typically must be generally visible, and the visual appearance of the PV layers themselves cannot be significantly altered from the comparatively dark greyscale to black presentations provided by the facial surfaces without rendering the layers significantly less efficient, substantially degrading their operation. Presence of photocells and PV layers in most installations is, therefore, easily visually distinguishable, often in an unacceptably distracting, or appearance degrading, manner. Based on these drawbacks and/or limitations, inclusion of photocell arrays, and even sophisticated Thin Film Photovoltaic Cells (TFPV) material layers, is often avoided in many installations, or in association with many structures, objects or products that may otherwise benefit from the electrical energy harvesting capacity provided by these layers. PV layer installations are often shunned as unacceptable visual detractors or distractors adversely affecting the appearance or ornamental design of the structures, objects or products.

The last several decades have seen an expansive proliferation in all manner of self powered (read "battery-powered") devices. Developmental efforts are particularly evident in the introduction and commercialization of advanced electric vehicles, and particularly electric passenger vehicles by many of the major automotive manufacturers worldwide.

The original electric passenger vehicles had very limited range based predominantly on limited battery size and first-generation efficiency in those batteries. Developments in battery technology have extended these ranges to some degree. A challenge remains with respect to extending usable ranges for the electric vehicles even further. This challenge is particularly acute in areas in which infrastructure development, particularly with respect to the emplacement, and identification of locations, of electric vehicle charging stations have failed to keep pace with the commercialization of the electric vehicles themselves.

The comparatively limited ranges of electric vehicles, and the limited accessibility to remote charging stations, has limited advancement in the field of electric vehicles based in part on a phenomenon commonly referred to as "range anxiety." Concern over limiting one's driving habits based on an ability to access a known power source to recharge the electric vehicle has tended to serve as a detractor to broader commercialization of electric vehicle technology.

Separately in virtually all vehicles, a power drain on the installed electrical generation and storage systems in vehicles has increased rapidly and substantially. This power drain has increased as the numbers and types of separately electrically-powered devices, provided for driver and/or passenger safety and/or convenience in all manner of vehicles, including electric vehicles, have increased.

SUMMARY

The 143 and 145 applications introduce systems and methods that provide particularly formulated energy or light transmissive overlayers, which may be provided to "hide" typical photoelectric energy generating devices. These overlayers, generally in the form of surface treatments and/or coverings, are formulated to support unique energy transmission and light refraction schemes to effectively "trick" the human eye into seeing a generally opaque surface when observed from a light incident side. These overlayers are formulated to support transmission of visual light, or near-visual light, in a manner that allows a substantial percentage (at least 50% and up to 80+%) of the electromagnetic energy impinging on the surface of the overlayer to penetrate the surface treatments and coverings in a comparatively unfiltered manner. The overlayers also provide an opaque appearing surface that exhibits an essentially same appearance when viewed from any viewing angle, and that support a consistently superior light transmission across a full range of light impingement angles. The energy transmissive layers disclosed in the 143 and 145 applications rely on a particular cooperation between refractive indices of the disclosed micron-sized particles or spheres with cooperating refractive indices of the matrix materials in which those micron-sized particles are suspended for deposition on prepared surfaces. This coincident requirement between the refractive indices of the matrix material on the refractive indices of the suspended particles limits deposition of these material suspensions of particles on substrates to techniques in which the deposition of the materials can be carefully controlled.

U.S. patent application Ser. No. 15/415,851, filed in the USPTO on Jan. 25, 2017, entitled "Compositions Of Materials For Forming Coatings And Layered Structures Including Elements For Scattering And Passing Selectively Tunable Wavelengths Of Electromagnetic Energy", which published as U.S. Patent Publication US 2018-0210121 A1 on Jul. 26, 2018; and U.S. patent application Ser. No. 15/415,857, filed in the USPTO on Jan. 25, 2017, entitled "Methods For Making Compositions Of Materials For Forming Coatings And Layered Structures Including Elements For Scattering And Passing Selectively Tunable Wavelengths Of Electromagnetic Energy" which published as U.S. Patent Publication US 2018-0210122 A1 on Jul. 26, 2018; and U.S. patent application Ser. No. 15/415,864, filed in the USPTO on Jan. 25, 2017, entitled "Delivery Systems and Methods For Compositions Of Materials For Forming Coatings And Layered Structures Including Elements For Scattering And Passing Selectively Tunable Wavelengths Of Electromagnetic Energy," which published as U.S. Patent Publication US 2018-0210119 A1 on Jul. 26, 2018; the disclosures of which are each hereby incorporated by reference herein in their entirety, improve upon the inventive concepts disclosed in the 143 and 145 applications by controlling the refractive indices of the particles themselves to capture all of the physical parameters leading to independent color selection in the particles, thereby easing reliance on a cooperative synergy between a composition of the particles and a composition of the binder or matrix material in which the particles are suspended.

It would be advantageous to apply the selectively colorable and/or texturizable overlayers disclosed in detail in the above applications to energy harvesting systems associated with vehicles, including passenger vehicles to (1) extend ranges of battery-powered electric vehicles, (2) reduce reliance on a particular charging infrastructure by provide autonomous battery charging systems in the vehicles themselves, (3) individually power at least some of the myriad electrical component devices mounted in, or associated with, the vehicles to reduce a draw on vehicles' conventional electrical power generation and storage systems, and/or (4) reduce the cycle depth of the batteries, thereby increasing the useful lifetimes of the batteries and reducing costs associated with battery replacement, as the batteries in electric vehicles are, for example, generally among the most costly subsystems in the those vehicles.

Exemplary embodiments may provide substantially transparent micron-sized particles in a cooperating binder matrix to produce material compositions for layers in which refractive indices of the constituent elements of the layers are cooperatively controlled to produce repeatable coloration in the layers causing them to appear opaque from a light-incident side, and yet retaining a capacity to transmit at least 50%, and as much as 80+%, of the incident electromagnetic energy therethrough to impinge, for example, on photoelectric or photovoltaic energy harvesters positioned behind the layers.

Exemplary embodiments may form energy transmissive layers over photovoltaic arrays, the energy transmissive layers providing an opaque appearing surface that exhibits an essentially same appearance when viewed from any viewing angle, and supporting a consistently superior light transmission across a full range of light impingement angles.

Exemplary embodiments may provide a TFPV material layer on a substrate that is in a form of a discrete vehicle body portion. The disclosed TFPV material layers may be adhesively conformed to the discrete vehicle body portion and then hidden by being overcoated with the disclosed energy transmissive overlayer material.

Exemplary embodiments may provide electrical circuits that convert the energy collected by the TFPV layer into usable electrical power for use by the conventional electrical systems in the vehicle and/or individual electrical devices installed in the vehicle.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed method for forming a unique set of structural features on an outer surface of a vehicle body structure that combine to implement an aesthetically neutral, or aesthetically pleasing, energy harvesting system that is configured to provide autonomous electrical power to a vehicle, and/or to electrically-powered devices in the vehicle, will be described, in detail, with reference to the following drawings, in which.

DETAILED DESCRIPTION OF EMBODIMENTS

Figure 1:
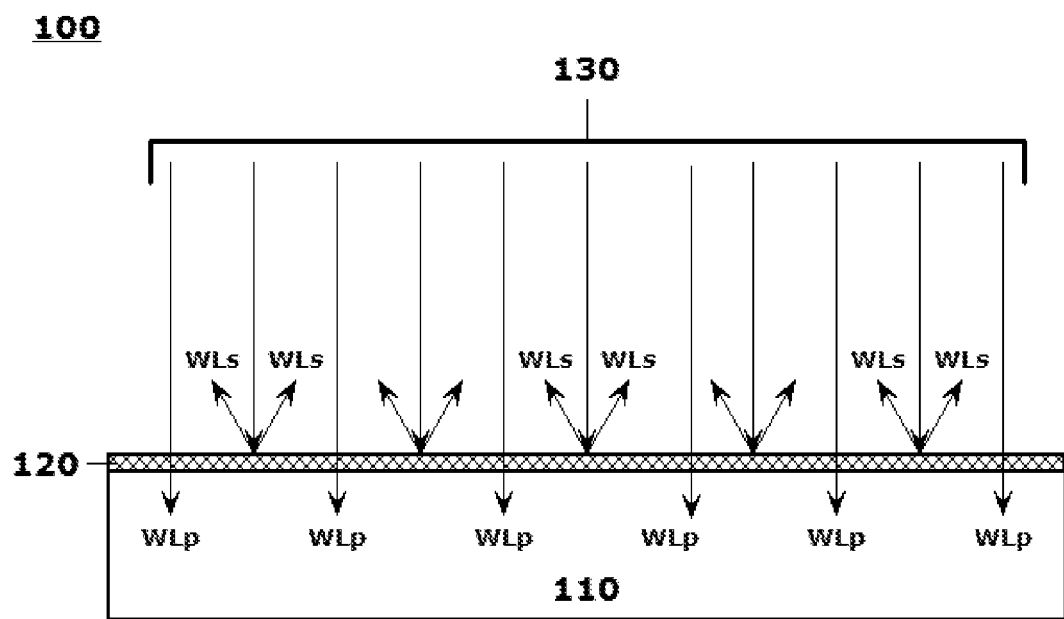
FIG. 1 illustrates a schematic diagram of an exemplary object energy/light scattering surface layer disposed on a structural body member substrate according to this disclosure.

The disclosed methods for forming a unique set of structural features on an outer surface of a vehicle body structure, the structural features combining to implement an aesthetically neutral, or aesthetically pleasing, energy harvesting system that is configured to provide autonomous electrical power to a vehicle, and/or to electrically-powered devices in the vehicle, will be described as being particularly usable for extending a range of an electric vehicle and providing autonomous vehicle-integrated charging capacity for the energy storing devices in the electric vehicle. These real-world applications for the disclosed energy harvesting systems should not be considered as limiting those systems to charging, recharging, powering, or otherwise providing electrical power to any particular battery, or other electrical system component, only in an electric vehicle. Rather, the disclosed embodiments are intended to provide an overview of a particular system that may be implemented to autonomously provide electrical power to any vehicle and/or to any electrically-powered vehicle-installed devices.

Reference will be made to substantially transparent multi-layer micron-sized particles, and the material compositions in which those particles may be delivered, and the systems and methods for delivery of those material compositions onto vehicle substrate surfaces that have been previously provided with conformal photovoltaic arrays, particularly in a form of a TFPV material layer, according to this disclosure. The disclosed schemes may include techniques for depositing and curing material compositions that suspend substantially transparent multi-layer micron-sized particles in substantially transparent binder or matrix materials, techniques for developing material compositions into structural layers, and delivery systems and techniques for developing the multi-layered structure, which may be a laminated structure, in which color-selectable electromagnetic energy transmissive layers are formed over the photovoltaic components. These layers, once formed, may selectively scatter specific wavelengths of electromagnetic energy impinging on an energy incident side of the layers, while allowing remaining wavelengths of the electromagnetic energy to pass therethrough. These layers may uniquely implement optical light scattering techniques in such energy transmissive layers to provide an aesthetically neutral outer surface that is substantially comparable to a conventional vehicle painted surface. These layers may also provide an opaque appearing surface that exhibits an essentially same appearance when viewed from any viewing angle, and that supports a consistently superior light transmission across a full range of light impingement angles. Because the disclosed "coatings" do not include pigment materials, the overlayers comprised of these substantially transparent materials are not susceptible to fading over time. In order to provide a usable electrical energy, the disclosed ovelayers may be particularly formed to selectively scatter particular wavelengths of electromagnetic energy, including light energy in the visual, near-visual or non-visual range, while allowing remaining wavelengths to pass therethrough with a transmissive efficiency of at least 50%, and as much as 80+%, with respect to the impinging energy.

Additional details regarding the above-discussed energy transmissive layers are available in the various related applications catalogued above, the disclosures of which are incorporated by reference herein in their entireties.

Exemplary embodiments described and depicted in this disclosure should not be interpreted as being specifically limited to any particularly limiting material composition of the individually-described substantially transparent multi-layer micron-sized particles, and the binder matrices in which those particles may be suspended, except as indicated according to the material properties generally outlined below. Further, the exemplary embodiments described and depicted in this disclosure should not be interpreted as specifically limiting the configuration of any of the described layers, or of the particular vehicle body structures, or vehicle body structural components, as substrates on which the disclosed energy harvesting structures may be formed.

References will be made to individual ones, or classes, of energy/light collecting sensor components and energy/light activated devices that may be operationally mounted in, installed in or placed behind the disclosed energy/light scattering, light directing or light transmissive layers so as to be hidden from view when an object including such sensor components or devices is viewed from a viewing, observation or light incident outer surface of the object or layer, from which perspective the energy/light scattering, light directing or light transmissive layers may appear "opaque" to the incident electromagnetic energy. These references are intended to be illustrative only and are not intended to limit the disclosed concepts, compositions, processes, techniques, methods, systems and devices in any manner. It should be recognized that any advantageous use of the disclosed structures and schemes for providing an autonomous energy harvesting capability in a vehicle employing systems, methods, techniques, and processes such as those discussed in detail in this disclosure is contemplated as being included within the scope of the disclosed exemplary embodiments.

In this regard, the disclosed systems and methods will be described as being particularly adaptable to hiding certain photovoltaic materials, and the emerging class of increasingly efficient TFPV materials or material layers, which are typically mils thick, on the surfaces of, or within objects, behind layers that may appear opaque from a viewing, observation or light incident side. As used throughout the balance of this disclosure, references to TFPV material layers are not intended to exclude other types of photovoltaic materials, and/or any generally known configuration as to any photocells, which may be adapted for use in particular vehicle body structural components.

FIG. 1 illustrates a schematic diagram 100 of an exemplary object energy/light scattering surface layer 120 disposed on a transparent portion of a body structure 110. As shown in FIG. 1, the energy/light scattering layer 120 is configured to allow first determined wavelengths of energy/light, WLp, to pass through the energy/light scattering layer 120. The configuration of the energy/light scattering layer 120 simultaneously causes certain second determined wavelengths of energy/light, WLs, to be scattered back in an incident direction substantially as shown.

The energy/light scattering layer 120 may be configured of substantially transparent micron-sized particles of varying sizes. In embodiment, these particles may be substantially in a range of 5 microns or less. The substantially transparent micron-sized particles may be stabilized in structural or other layers further comprised of substantially-transparent matrix materials including, but not limited to, dielectric materials. An ability to configure the substantially transparent micron-sized particles to "tune" the light scattering surface of the light scattering layer 120 to scatter particular second determined wavelengths of energy/light, WLs, may provide the capacity of the energy/light scattering layer 120 to produce a desired visual appearance in a single color, multiple colors, or according to an image-wise visual presentation provided by the energy/light scattering layer 120. Put another way, depending on a particular composition of the substantially transparent micron-sized particles comprising the energy/light scattering layer 120 (or multiple layers), one or more colors, textures, color patterns, or color-patterned images may be visually produced by the energy/light scattering layer 120.

In cases where the incident energy includes wavelengths in the visual spectrum, refractive indices of the energy/light scattering layer 120 may be selectively tuned based on structural compositions of the substantially transparent micron-sized particles, and the substantially-transparent binder or matrix materials in which the particles are suspended. In embodiments for use in vehicles according to this disclosure, the energy/light scattering layer 120 is intended to appear as a single color across a surface of the energy/light scattering layer 120. To this end, the composition of the particles and matrix scheme across the surface of the energy/light scattering layer 120 may be substantially identical, or homogenous.

A light scattering effect of the energy/light scattering layer 120 may be produced in response to illumination generally from ambient light in a vicinity of, and/or impinging on, the surface of the energy/light scattering layer 120. Alternatively, the light scattering effect of the energy/light scattering layer 120 may be produced in response to direct illumination generally produced by some directed light source 130 focusing illumination on the light-incident surface of the energy/light scattering layer 110.

Figure 2:
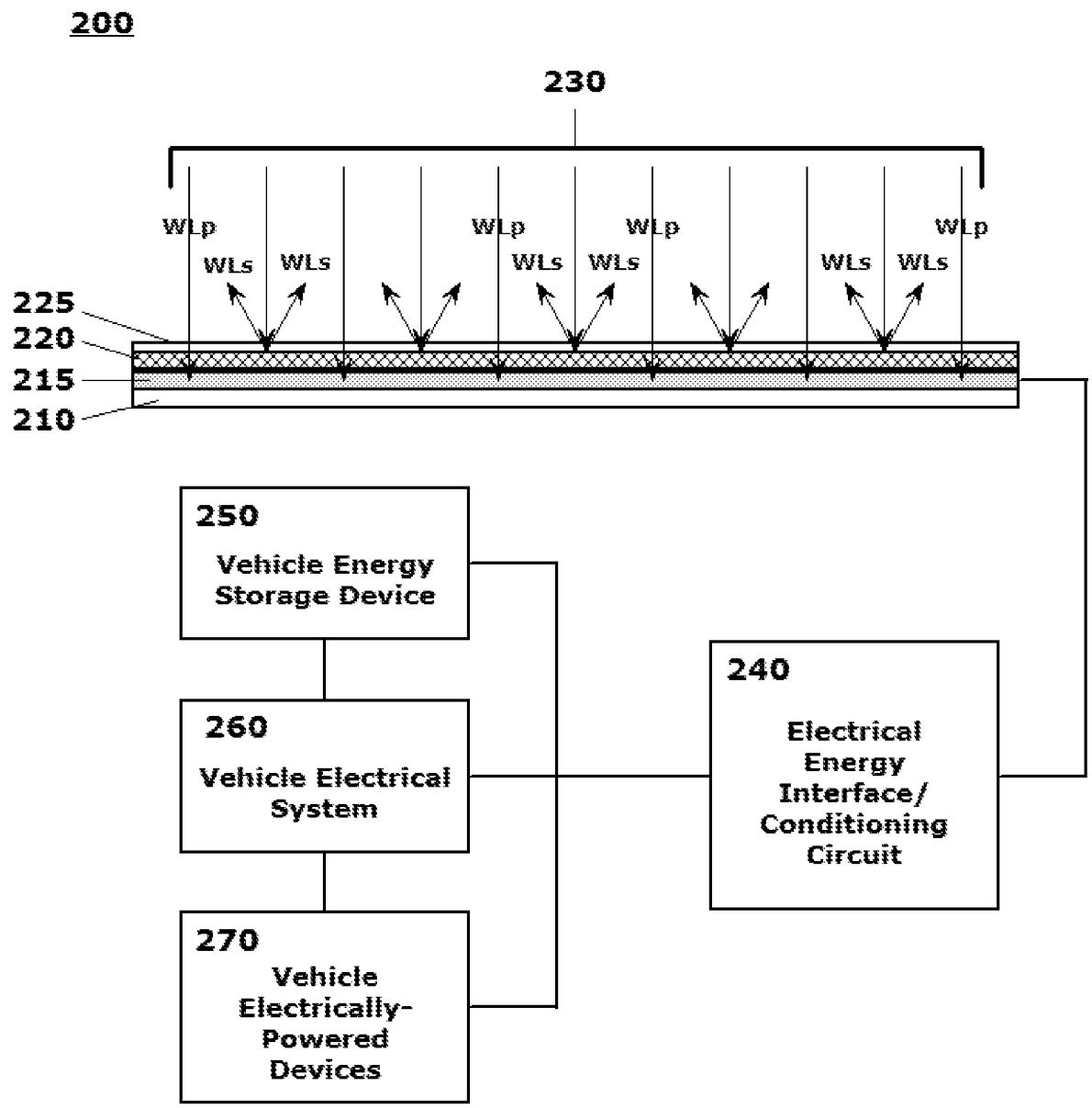
FIG. 2 illustrates a schematic diagram of an exemplary vehicle energy harvesting system including a laminated energy harvesting component with, as one or more of the laminate layers, a TFPV material layer disposed on a vehicle body structure component substrate, and an energy/light scattering layer according to this disclosure disposed over the TFPV material layer.

FIG. 2 illustrates a schematic diagram 200 of an exemplary vehicle energy harvesting system including a laminated substrate surface energy harvesting component with, as one or more of the laminate layers, a TFPV material layer disposed on a vehicle body structure component substrate, and an energy/light scattering layer according to this disclosure disposed over the TFPV material layer. As shown in FIG. 2, the ambient energy/light in a vicinity of the energy/light scattering layer 220, or the energy/light directed from an energy/light source 230 at the energy/light scattering layer 220, may pass through a substantially clear overlayer 225, which may be in the form of a substantially clear protective layer, including for example a standard automotive industry clear coat finish. The energy/light scattering layer 220 may be configured to operate in a same manner as the energy/light scattering layer described above with reference to FIG. 1. At least first wavelengths of energy/light, WLp, may pass through the energy/light scattering layer 220, while at least the second wavelengths of energy/light, WLs, may be scattered back in the incident direction in the manner described above.

The at least first wavelengths of energy/light, WLp, may impinge on a TFPV material layer 215 that may be disposed on, or adhered to, a surface of a vehicle body structure component substrate 210. The at least first wavelengths of energy/light, WLp, impinging on the TFPV material layer 215 may cause the TFPV material layer 215 to generate electrical energy which may be passed to an electrical energy interface/conditioning circuit 240 to which the TFPV material layer 215 is electrically connected. The electrical energy interface/conditioning circuit 240 may properly translate or otherwise condition the generated electrical energy from the TFPV material layer 215 to be one or more of (1) stored in a compatible vehicle energy storage device 250, (2) used to directly supplement the vehicle electrical system 260 or (3) provided to directly power one or more vehicle electrically-powered devices 270. The batteries in electric vehicles are generally among the most costly subsystems of the vehicles. The addition of the electric energy generated by the disclosed systems may reduce a cycle depth of the batteries, thereby increasing the useful lifetimes of batteries and reducing the costs associated with battery replacement.

FIGS. 3A-3D illustrate a series of schematic diagrams of steps in an exemplary process 300 for forming a laminated energy harvesting component, with at least one layer constituted as a light scattering constituent layer, according to this disclosure.

Figure 3A:
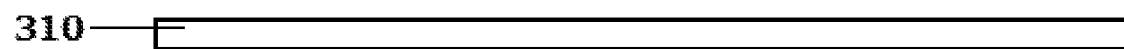
FIGS. 3A-3D illustrate a series of schematic diagrams of steps in an exemplary process for forming a laminated energy harvesting component, with at least one layer constituted as an energy/light scattering layer, according to this disclosure.

As shown in FIG. 3A, a substrate component 310 may be provided. The substrate component 310 may be, for example, a vehicle structural component processed separately from the vehicle, as the vehicle moves down the assembly line. Such a vehicle structural component may be one or more of a hood, a trunk lid, a roof panel, a fender or other comparable discrete body part, or any body portion. Otherwise, the substrate component 310 may be simply a discrete portion of the vehicle body structure particularly targeted as the vehicle moves down the assembly line.

Figure 3B:
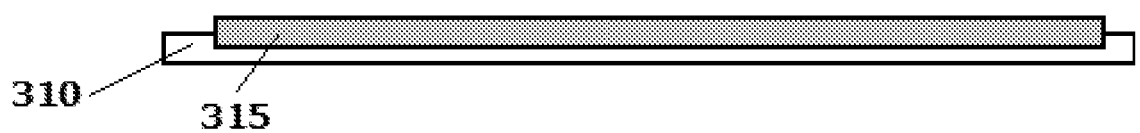

As shown in FIG. 3B, a photovoltaic layer (or component) 315 may be disposed on the substrate component 310. The photovoltaic layer 315 may comprise one or more of a photocell, an array of photocells, or a TFPV material layer. Further, the photovoltaic layer 315 may be positioned on a contiguous surface of the substrate component 310, or may be partially embedded in a cavity in the surface of the substrate component 310, or may be completely embedded in a cavity in the surface of the substrate component 310 in a manner that an upper surface of the photovoltaic layer 315 substantially corresponds to an upper surface of the substrate component 310. In embodiments, a TFPV material layer may be adhesively attached to, or formed on, the substrate component 310. In embodiments, a surface treatment may be applied to portions of the surface of the substrate component 310 that are not covered by the photovoltaic layer 315. The surface treatment, when applied, is intended to render an optical reflectance of the portions on which the surface treatment is applied to be substantially equal to an optical reflectance of the TFPV material layer in order to provide a consistent undersurface for application of an energy/light scattering layer.

Figure 3C:
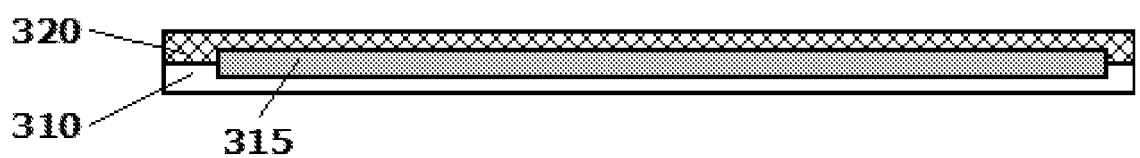

As shown in FIG. 3C, an energy/light scattering layer 320 may be formed on/over the photovoltaic layer 315 in a manner that first determined wavelengths of the ambient light in the vicinity of the energy/light scattering layer 320 may pass through the energy/light scattering layer 320, in the manner described above with reference to the embodiments shown in FIGS. 1 and 2, while at least second determined wavelengths of the ambient light may be scattered back off the energy/light scattering layer 320 in the incident direction in the manner described above.

Figure 3D:
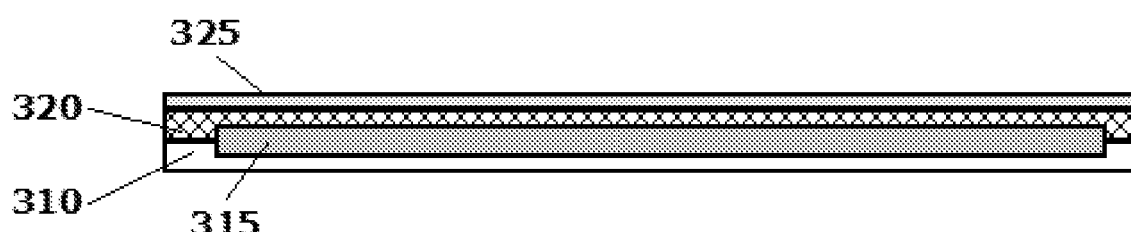

As shown in FIG. 3D, the laminated structure of the energy harvesting component may be finished by covering, or even encapsulating, the laminated structure in a substantially clear, protective overcoat or outer layer 325. This protective overcoat or outer layer 325 may be in a form, for example, of a clear coat finish as may be typically or conventionally used in automotive manufacturing and automotive surface finishing.

Figure 4:
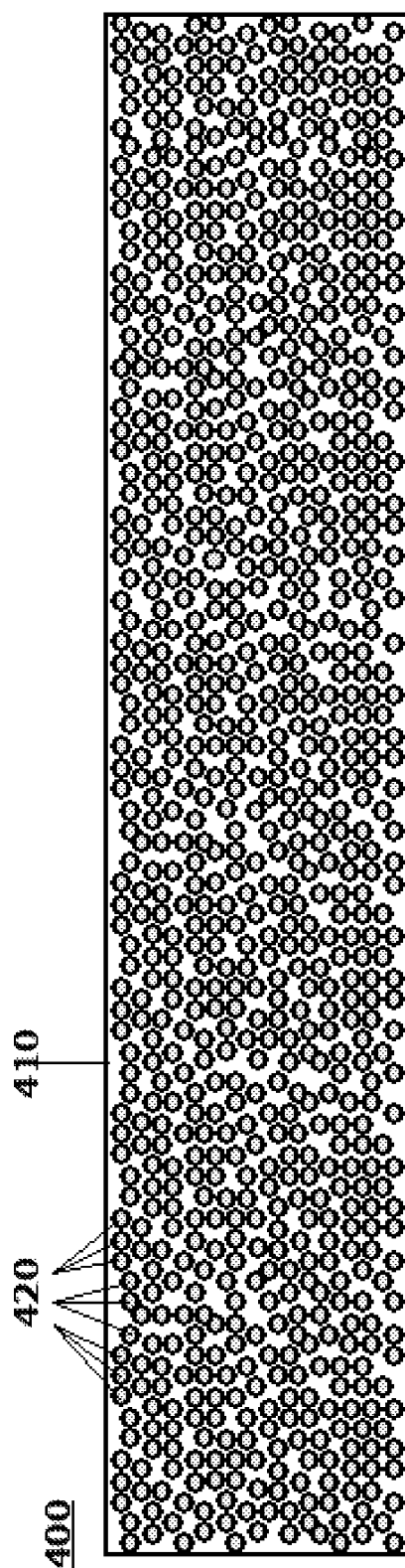
FIG. 4 illustrates an exemplary embodiment of a detail of an energy/light scattering layer usable in the energy harvesting systems according to this disclosure.

FIG. 4 illustrates an exemplary embodiment of a detail of an energy/light scattering layer 400 according to this disclosure. The disclosed schemes, processes, techniques or methods may produce an energy/light scattering layer 400 created using substantially transparent multi-layer micron-sized particles 420. Those particles may be in range of diameters of 5 microns or less embedded in a substantially-transparent dielectric matrix 410. As an example, the substantially transparent multi-layer micron-sized particles 420 may include titanium dioxide nanoparticles in a layered form. Titanium dioxide is widely used based on its brightness and comparatively high refractive index, strong ultraviolet (UV) light absorbing capabilities, and general resistance to discoloration under exposure to UV light.

In embodiments of the energy/light scattering layers, colorations of the layered materials may be achieved through combinations of (1) material compositions of the particles, (2) material compositions of the binders, (3) nominal particle sizes, (4) nominal particle spacings, and (5) interplay between any or all of those material factors. That "interplay" is important. In other embodiments, the material interplay may be captured in varying layers of a substantially transparent multi-layer micron-sized particle, thus requiring the only variables to be controlled as particle size and particle physical composition. Capturing all of the physical parameters in the substantially transparent multi-layer micron-sized particle substantially eliminates any requirement for constituent interplay between the particles and the binder, essentially rendering the particles binder or matrix material agnostic. In embodiments including the multi-layer particles, the binder or matrix material is provided simply to hold the particles where they land. Spacing between the particles is rendered based on a substantially clear, neutral outer coating on the substantially transparent multi-layer micron-sized particles, typically of a substantially transparent dielectric material having a comparatively low (less than 2) index of refraction. The employment of multi-layer particles provides increased latitude in the use of randomized delivery methods, including spray delivery of an aspirated composition of non-pigment particulate material suspended in a comparatively transparent or relatively clear binder material.

In embodiments with particles comprised of layered constructions, a core sphere may have a diameter to accommodate an optical path length through the core of approximately one half wavelength of light for the color of interest and may be comprised of 15 or more individual material layers each having a thickness to accommodate an optical path length through the layer of one quarter wavelength of light for the color of interest. For individualized colors from blue to red this layer-on-layer construction surrounding the core sphere may result in an overall particle size of from about 1.9 microns up to 2.6 microns. This range of overall particle sizes for the multi-layered construction of the transparent spheres is comparable to the typical ranges of diameters of paint pigment particles. Apparent colors, patterns or images of light scattering layers may be produced by adjusting refractive indices of the particles according to a size of the spherical core and the layers of material deposited on the spherical core of the particles. Such particle compositions allow for additional degrees of freedom in adjusting the color, transmission and scattering, i.e., in "tuning" the energy/light scattering effects produced by the composition of the energy/light scattering layer. As mentioned above, an outer layer may be formed of a neutral, transparent, often dielectric material of a thickness selected to provide a minimum required separation between the "colorant" layers of the substantially transparent multi-layer micron-sized particles to reduce instances of refractive interference thereby causing variation in the color presentation provided by the light scattering layer.

Dielectric materials from which the core sphere and the dielectric materials may be selected may be chosen generally from a group consisting of titanium dioxide, silicon carbide, boron nitride, boron arsenite, aluminum nitride, aluminum phosphide, gallium nitride, gallium phosphide, cadmium sulfide, zinc oxide, zinc selenide, zinc sulfide, zinc telluride, cuprous chloride, tin dioxide, barium titanate, strontium titanate, lithium niobate, nickel oxide, and other similar materials.

Particle size is related to the wavelength of interest, in the manner described above, in order to determine the color of the substantially transparent multi-layer micron-sized particles. Spacing between the particles is related to the size in order to reduce interference between the refractions of separate particles. In embodiments, the binder index of refraction may be the same as an outer layer of the particles in order that the outer layer does not optically interact with the next layer inward. In such an instance, the outer layer may be thicker and particle-to-particle optical interaction is minimized. Because where there is a difference in index of refraction (according to Snell's Law), a reflection occurs. When two reflections are spaced properly, the interaction of multiple reflections is what provides the color.

The outer layer may be configured to ensure that the colorant producing layers of the particles are kept separated. In an instance in which the colorant producing layers touch, no interaction reflection is generated. A result of a configuration of a particle according to this scheme is a particle that acts in a form of a Bragg Reflector. Multiple weak reflections of a same wavelength reinforce each other resulting in a strong reflection of a particular wavelength based on the particle size, which determines the particle spacing, and the index of refraction also determines the speed of light which in turn describes the optical wavelength. A number of particles per unit volume of solvent (matrix material) essentially ensures that the particles always touch.

The outer layer will typically be thicker than the under-layers of which the substantially transparent multi-layer micron-sized particle is comprised in order to attempt to ensure that safe separation is maintained. If the outer layer is controlled to be composed of a material that is at a same index of refraction as the binder or matrix material, the outer layer does not optically react in interaction with the binder or matrix material. The outer layer will be transparent, and maintain that transparency when immersed in the substantially-transparent binder or matrix material having a same index of refraction as the outer layer of substantially transparent multi-layer micron-sized particles. In this manner, the outermost layers, in their composition and thickness, provide the essential interstitial spacing between the colorant components so as to assure color fidelity. The layers thus formed will yield only the color that is "built in" to the substantially transparent multi-layer micron-sized particles according to the structure of the color yielding/generating underlayers inward of the outermost layers in the manner described below.

With enough layers, in a range of 10 to 15, to as many as 30, layers, color concentration would be high enough in each of the particles so as to not require external coloration reinforcement provided by adjacent multi-layer particles. The outer layers are comparatively clear, as is the binder or matrix solution, and preferably having a comparatively same index of refraction as between the material forming the outer layers and the material forming the binder solution. This is to ensure that there is no interaction between the particles in the binder, and no interaction between the particles, specifically the color yielding/generating components of the particles over a longer distance. The outer layers may be comparatively, e.g., 10 times the thickness of each of the underlying dielectric layers.

The substantially transparent multi-layer micron-sized particles may be formed in a very tightly-controlled particle build process. A spherical core may be formed in a material or layer deposition process such as, for example, an atomic layer deposition (ALD) process, to achieve the substantially transparent multi-layer micron-sized particles according to the disclosed schemes. Particle deposition control systems exist that can be scaled to produce these substantially transparent multi-layer micron-sized particles. Quality control in the particle build process produces the necessary level of color consistency. There are, however, deposition processes that can be controlled to the units of nanometers thicknesses.

Additionally, embodiments of the multi-layered particles may include metallic layers sandwiched in between pairs of dielectric layers. A thickness of the metallic layers may be between 0.01 nm and 10 nm, as long as the metallic layers remain substantially transparent. The presence of such metallic layers is intended to enhance reflectivity properties with respect to the multi-layered structure of the color yielding/generating layers of the substantially transparent multi-layer micron-sized particles. Indium titanium oxide (ITO) is an example of a metallic layer that is conductive, yet substantially transparent. A typical touch screen on a cellular telephone, for example, includes an ITO surface.

Any suitable acrylic, polyurethane, clearcoat, or like composed binder or matrix material having a low index of refraction may be adapted to suspend the multi-layer micron-sized particles for application to a broad spectrum of substrate materials. These may include, but not be limited to, for example, synthetic or natural resins such as alkyds, acrylics, vinyl-acrylics, vinyl acetate/ethylene (VAE), polyurethanes, polyesters, melamine resins, epoxy, silanes or siloxanes or oils. It is envisioned that, in the same manner that paint pigment particles are suspended in solution, the substantially transparent multi-layer micron-sized particles according to this disclosure may be suspended in solution as well. Unlike paint pigment particles, however, the optical response of particles according to the disclosed schemes will not "fade" over time because there is no pigment breakdown based on exposure to, for example, ultraviolet (UV) radiation. The disclosed particles may also be substantially insensitive to heat.

According to the above, application methodologies that are supportable with particles according to the disclosed schemes include all of those application methodologies that are available for application of paints, inks and other coloration substances to substrates. These include that the particles suspended solutions can be brushed on, rolled on, sprayed on and the like. Separately, the particles may be pre-suspended in the solutions for on-site apparatus mixing into the deliverable solutions at the point of delivery to a substrate surface. The particles may be delivered via conventional aspirated spray systems and/or via aerosol propellants including being premixed with the propellants for conventional "spray can" delivery. Finally, the particles may be dry delivered to a binder-coated substrate. Conventional curing methods may be employed to fix the binder-suspended particles on the various substrates.

In the above-described manner, a finished and stabilized apparent colored, multi-component colored, texturized or otherwise image-developed surface transparent light scattering layer is produced. Mass production of such layers could be according to known delivery, deposition and development methods for depositing the light scattering layer forming components on the base structures as layer receiving substrates, and automatically controlling the exposure, activation and/or stabilization of the surface components to achieve a particular colored, multi-colored, texturized and/or image-wise patterned light scattering layer surface.

Additives may be included in the binder or matrix materials in which the substantially transparent multi-layer micron-sized particles are, or are to be, suspended to enhance one or more of a capacity for adherence of the formed transmissive layer to a particular substrate, including an adhesive or the like, and a capacity for enhanced curing of the layer, including a photo initiator or the like.

Figure 5A:
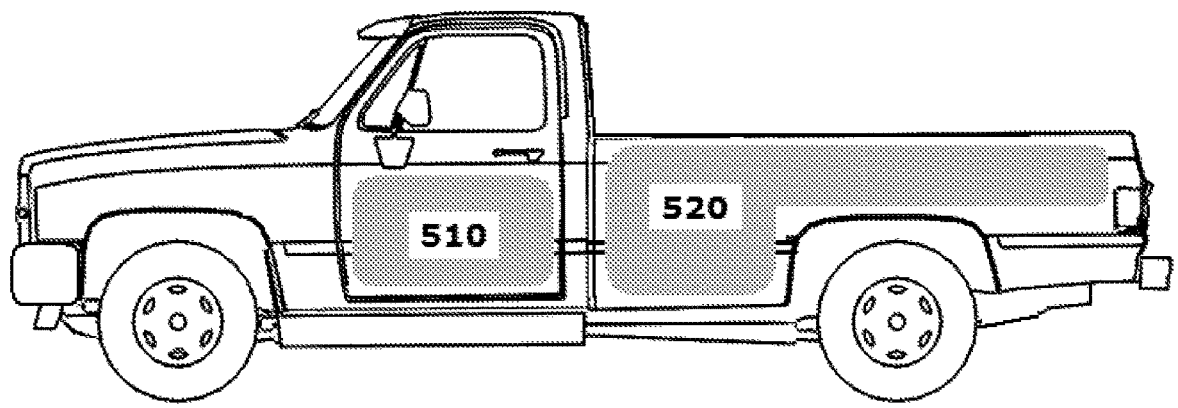
FIGS. 5A and 5B illustrate schematic diagrams of an exemplary vehicle to provide examples of emplacement of a laminated energy harvesting component according to this disclosure on an outer surface of the body structure of the exemplary vehicle.
Figure 5B:
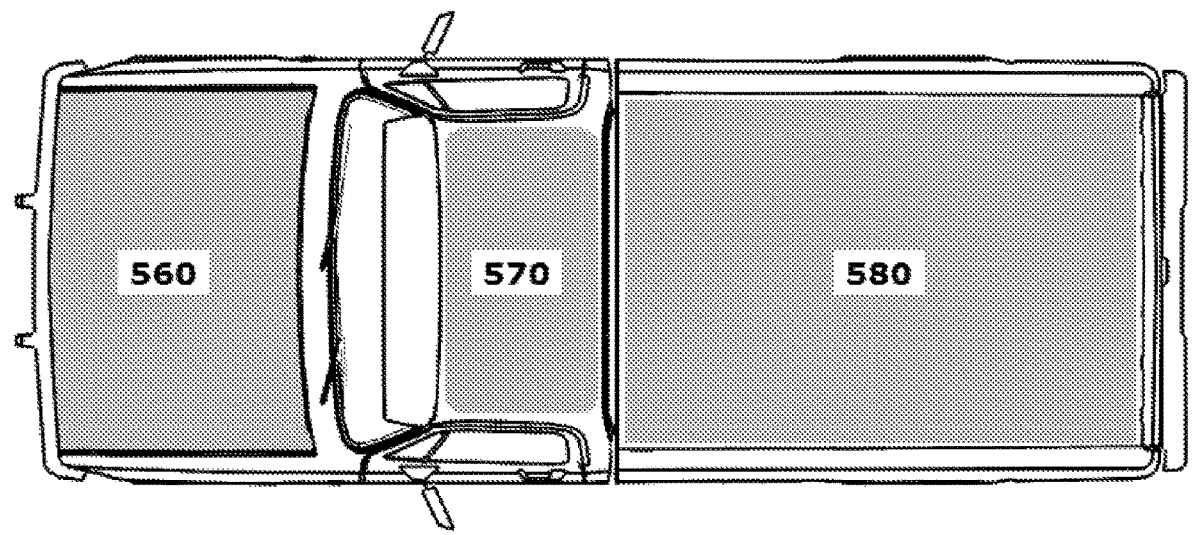

FIGS. 5A and 5B illustrate schematic diagrams of an exemplary vehicle to provide examples of emplacement of a laminated energy harvesting component according to this disclosure on an outer surface of the body structure of the exemplary vehicle. Although depicted in FIGS. 5A and 5B as a vehicle in a form of a pickup truck, it should be noted that any vehicle may serve as a host to the disclosed laminated energy harvesting component. As shown in FIG. 5A, any substrate surface of a structural body component of a vehicle may be used to host the laminated energy harvesting component. This may include a door of the vehicle hosting the energy harvesting component 510, or separately a body side panel hosting an energy harvesting component 520. Additionally, the body structural components may be partially or substantially completely covered with the laminated structure according to, for example, FIGS. 2 and 3 above. As shown in FIG. 5B, and as will be understood by those of skill in the art to be more preferable for better exposure to solar energy in sunlight, horizontal surfaces may be covered, partially or substantially completely, with a laminated energy harvesting component. Here, exemplary emplacements are shown on a hood 560, a roof component 570 and in a bed of the pickup truck 580. Separately, a solid, rollable, foldable or other cover in the form of, for example, a tonneau cover may be provided for emplacement over the bed in the area depicted as 580 in FIG. 5B. Regardless of the placement, wired or wireless connection may be provided to, for example, an energy conversion component under the hood 560 in the engine/motor compartment of the vehicle in order to collect the electrical energy generated by the photovoltaic layers in the laminated structure and to communicate compatible and/or conditioned electrical energy to the vehicle system components as described generally above in reference to FIG. 2.

Figure 6:
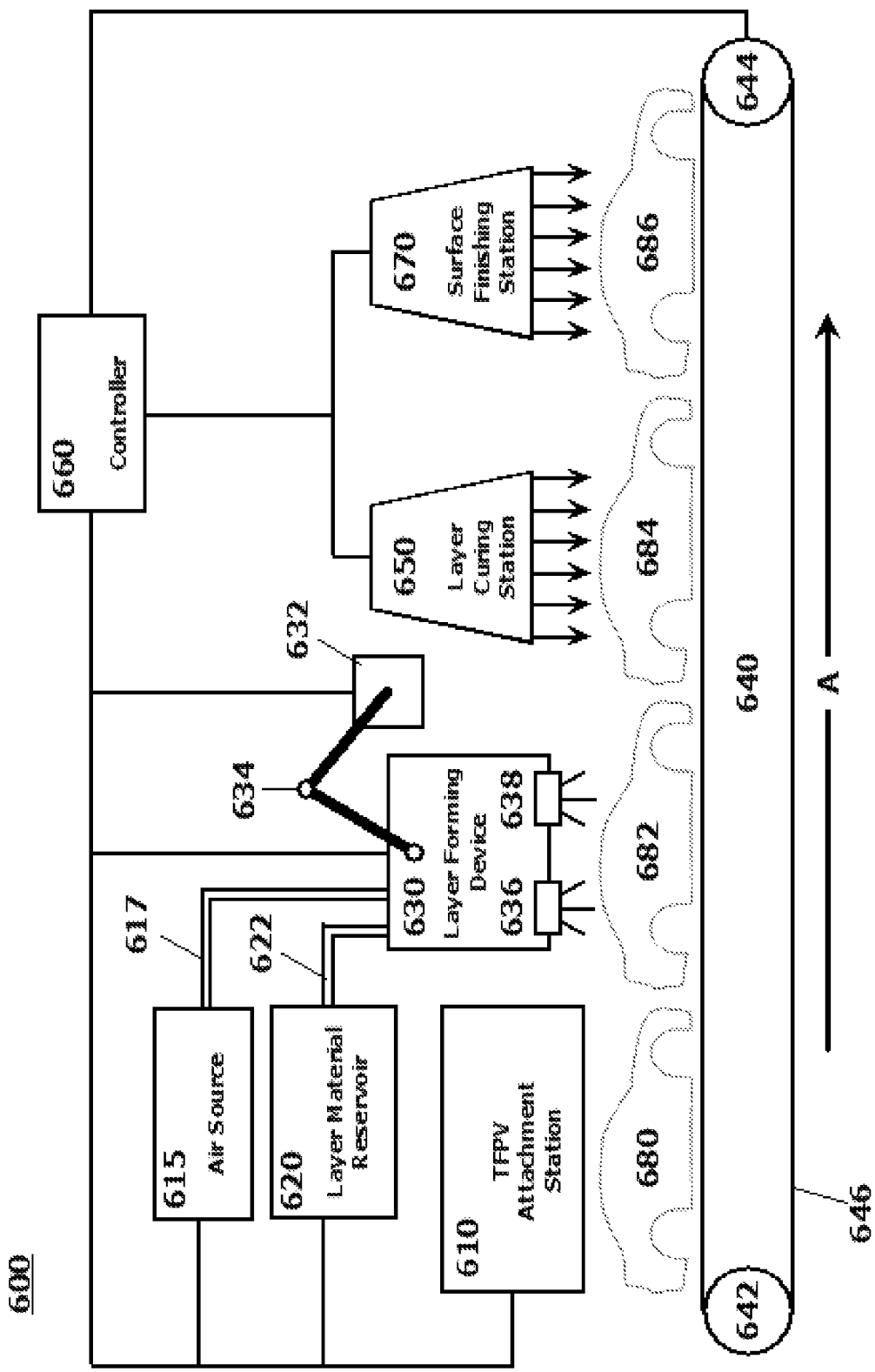
FIG. 6 illustrates a schematic diagram of an exemplary assembly line usable for automated forming of the exemplary laminated energy harvesting component on an outer surface of a vehicle body structure according to this disclosure.

FIG. 6 illustrates a schematic diagram of an exemplary assembly line usable for automated forming of the exemplary laminated energy harvesting component on an outer surface of a vehicle body structure according to this disclosure. The exemplary system 600 may be used to prepare and build the laminated energy harvesting component structure in a manner similar to that described above with reference to FIGS. 3A-3D.

As shown in FIG. 6, the exemplary system 600 may include an assembly line type transport component 640 which may be in a form of powered roller elements 642, 644 about which a movable platform in a form of, for example, a conveyor belt 646 may be provided to move a vehicle past multiple processing station 680, 682, 684, 686 in a direction A to accomplish the layer forming and finishing elements of the laminated energy harvesting component build process. Operation of the transport component may be controlled by a controller 660.

A photovoltaic array or TFPV attachment station 610 may be provided along the assembly line, or separately, to provide for adhesive adherence of, for example, a TFPV material layer on a surface of the vehicle when the vehicle is positioned at processing station 680. Those of skill in the art will understand that individual hood, door, trunk lid or roof panel elements may be separately processed by a separate TFPV attachment station 610, and provided to the assembly line process for attachment to the vehicle positioned at processing station 680. Operation of the TFPV attachment station 610 may be controlled by the controller 660.

A layer forming device 630 may be provided at, for example, processing station 682 as the vehicle moves in direction A from processing station 680. The layer forming device 630 may comprise a plurality of spray nozzles or spray heads 636, 638, which may be usable to facilitate deposition of a layer forming material over the previously placed TFPV material layer on a surface of the vehicle.

The layer forming device 630 may be connected to an air source 615 via piping 617 and may separately be connected to a layer material reservoir 620 via piping 622. The layer forming device 630 may be usable to obtain a flow of layer material from the layer material reservoir 620 and entrain that layer material in an airstream provided by the air source 615 in a manner that causes aspirated layer material to be ejected from the spray nozzles or spray heads 636, 638 in a direction of the vehicle when the vehicle is positioned at processing station 682.

The layer material reservoir 620 may include separate chambers for a supply of substantially transparent micron-sized particles and for a supply of binder or matrix material. In embodiments, the particles and the matrix material may come premixed, the particles and matrix material may be mixed in the layer material reservoir 620, or the particles and matrix material may be separately fed to the layer forming device 630 and mixed therein before being entrained in the airstream provided to the layer forming device 630 by the air source 615. The layer forming device 630 may be a mounting structure or, in embodiments, the layer forming device 630 may be a movable structure mounted to the end of, for example, an articulated arm 634 that is mounted to a base component 632. In embodiments, a particle and matrix material mixture may be provided in a material supply reservoir of a conventional spray gun with an air source for delivery of the layer material in a delivery operation similar to a conventional spray painting of a surface. In embodiments, an entire surface of the vehicle body structure may be covered with the light scattering layer material, not just the portions of the vehicle body structure covered in the TFPV material layers. In this manner, a consistency of coloration in the vehicle finish may be obtained as between areas including photovoltaic arrays and areas of the vehicle surface that do not include such underlying elements. Operation of the components of the layer forming device 630 (including the articulated arm 634 and the base component 632), the air source 615, and/or the layer material reservoir 620, may be separately controlled by the controller 660.

The vehicle body structure may be translated then to a processing position 684 opposite a layer curing station 650 that may employ known layer fixing methods including using heat, pressure, photo-initiated chemical reactions and the like to cure and/or finish the light scattering layers on the vehicle surface. The vehicle body structure may then be translated to a processing station 686 opposite a surface finishing station 670 which may, for example, to deposit a clearcoat over an entire surface of the vehicle, or undertake other finishing processing of the surface of the vehicle body component.

The exemplary system 600 may operate under the control of a processor or controller 660. Layer and object forming information may be input regarding at least one light scattering layer to be formed and fixed on an object or substrate by the exemplary system 600. The controller 660 may be provided with object forming data that is devolved, or parsed, into component data to execute a controllable process in which one or more light scattering layers are formed to produce a single color, a multi-color, texturized surface or an image-patterned presentation when viewed from the viewing, observation or light incident side of a finished light scattering layer on the vehicle.

Figure 7:
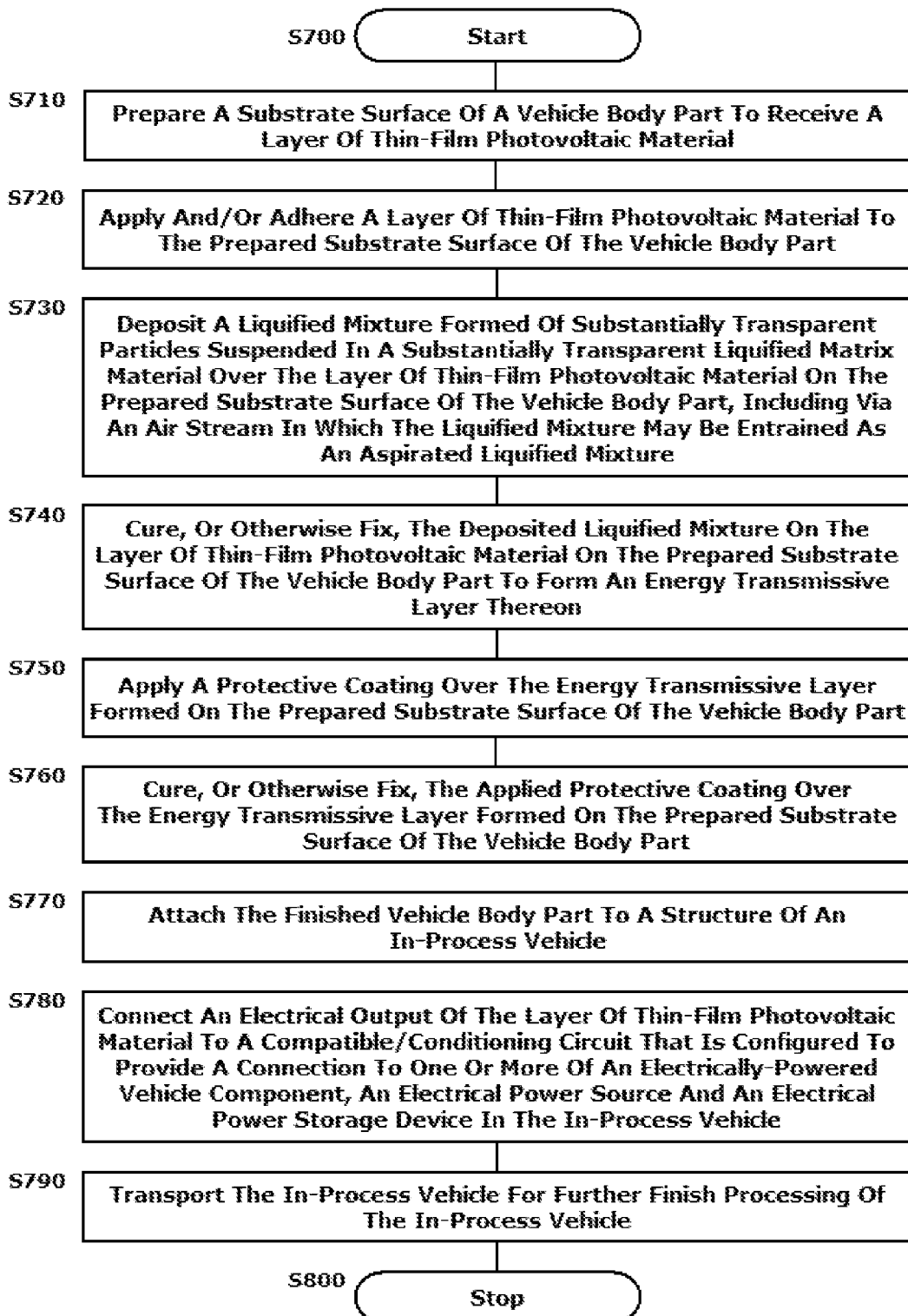
FIG. 7 illustrates a flowchart of an exemplary method for integrating a unique energy harvesting system, including an energy/light scattering layer, on an outer surface of a structural body member of a vehicle according to this disclosure.

The disclosed embodiments may include an exemplary method for integrating a unique energy harvesting system, including an energy/light scattering layer (energy transmissive layer), on a structural body member of a vehicle. FIG. 7 illustrates a flowchart of such an exemplary method. As shown in FIG. 7, operation of the method commences at Step S700 and proceeds to Step S710.

In Step S710, one or more discrete substrate surfaces of a vehicle body (a vehicle body part) may be prepared to receive a layer of TFPV material. The vehicle body part may be processed as a separate component, including, for example, a door panel, a hood, a trunk lid, a roof panel, or other vehicle body structural component, which may be later attached to an in-process overall body structure of a vehicle. Otherwise, the vehicle body part may be a discrete portion or portions of the in-process overall body structure of the vehicle. Operation of the method proceeds to Step S720.

In Step S720, a layer of TFPV material may be applied to the prepared substrate surface of the vehicle body part according to an application method that may adhere the layer of TFPV material to the body structure. Compatible adhesive materials, including chemical, heat, or light activated adhesive materials, may be used to provide the adherence of the TFPV material layer to the vehicle body part. It should be noted that portions of the particular vehicle body part, or other portions of the vehicle body structure, not covered by the TFPV material may be separately or coincidentally prepared with finishes that are comparable to the finish displayed by the TFPV material layer in order that the vehicle body part, or the overall body structure of the vehicle, may provide a consistent underlying appearance, particularly with regard to an optical reflectance, for application of the energy transmissive layer materials thereon. Operation of the method proceeds to Step S730.

In Step S730, a liquefied mixture of components for forming an energy transmissive layer composed of substantially transparent particles suspended in a substantially transparent liquefied matrix may be deposited over the layer of TFPV material, or over an entire body structure of the vehicle. Such deposition may be according to any technique by which a liquefied matrix, which may appear in the form of the paint-like substance, may be applied to any substrate. In this regard, the liquefied mixture may be poured on, rolled on, brushed on, or sprayed on the vehicle body surface. In this latter case, an airstream may be provided from an air source in which the liquefied mixture may be entrained as one of an aspirated and aerosol liquefied mixture. Operation of the method proceeds to Step S740.

As indicated above, in embodiments, the liquefied mixture may include formed multi-layered substantially transparent particles suspended in a substantially transparent liquefied matrix material to form the liquefied mixture. The substantially transparent liquefied matrix material may be selected to have an index of refraction similar to the substantially clear outer layers or shells of the substantially transparent particles in order to substantially reduce any potential for refractive interference between adjacent particles when deposited on the body structure surface of the vehicle. The substantially transparent liquefied matrix material may include components to aid in adherence of the finished energy transmissive layers on the portions of the vehicle body structure surface on which those layers are ultimately formed. The substantially transparent liquefied matrix material may include components to aid in fixing of the substantially transparent particles in the layer, including heat-activated and/or light-activated hardeners. The sizing of the particles to be less than 5 microns expands the latitude by which the substantially transparent particles suspended in the matrix material may be delivered to the body structure surface of the vehicle by rendering those particles compatible with the spray techniques discussed above. As such, in a delivery process that mirrors conventional spray painting, the aspirated liquefied mixture may be deposited on the prepared surface to form the energy transmissive layer that passes certain wavelengths of energy/light through the layer and scatters other selectable wavelengths of energy/light to render a perceptibly single color, multi-color, patterned, texturized or image-wise presentation of scattered light from the light incident surface based on one or more delivery passes for depositing the energy transmissive layer materials according to the above-described schemes.

In Step S740, the deposited liquefied mixture may be developed, cured, or otherwise fixed over the TFPV material layer, and on any other portions of the overall body structure of the vehicle onto which the liquefied mixture is deposited for coloration of those portions of the body structure of the vehicle to form a fixed energy transmissive layer thereon. Operation of the method proceeds to Step S750.

In Step S750, a protective coating may be applied over the energy transmissive layer. The protective coating may take a form of, for example, a commercial clearcoat finishing composition applied in conventional vehicle surface finishing. Operation of the method proceeds to Step S760.

In Step S760, the applied protective coating may be cured or otherwise fixed over the energy transmissive layer formed on the surface of the vehicle body part. Operation of the method proceeds to Step S770.

In Step S770, in instances in which the vehicle body part was a separate component of the overall vehicle body structure, the finished vehicle body part may be assembled to the in-process vehicle. Operation of the method proceeds to Step S780.

In Step S780, wired (or wireless) connections may be made from an electrical output of the layer of TFPV material to a compatible and/or conditioning circuit that is configured to provide a connection of the energy harvesting component in the form of the layered structure including the TFPV material layer to one or more of an electrically-powered vehicle component, an electrical power source in the vehicle and/or an electrical power storage device in the vehicle. Operation of the method proceeds to Step S790.

In Step S790, the in-process vehicle may be transported for further finish processing according to known methods. Operation of the method proceeds to Step S800, where operation of the method ceases.

The above-described exemplary particle and material formulations, layered component build processes, and systems and methods for applying laminated energy harvesting components to portions of a vehicle body structure reference certain conventional components, energy harvesting elements, materials, and real-world use cases to provide a brief, general description of suitable operating, product processing, energy/light scattering (transmissive) layer forming and vehicle body modification and integration environments in which the subject matter of this disclosure may be implemented for familiarity and ease of understanding. Although not required, embodiments of the disclosure may be provided, at least in part, in a form of hardware control circuits, firmware, or software computer-executable instructions to control or carry out the laminated structure development functions described above. These may include individual program modules executed by processors.

Those skilled in the optics, electrical generation and vehicle production arts will appreciate that other embodiments of the disclosed subject matter may be practiced in many disparate film forming, layer forming, laminate layer forming and vehicle production systems, techniques, processes and/or devices, including various machining, molding, additive and subtractive layer forming and manufacturing methods, of many different configurations.

Embodiments within the scope of this disclosure may include processor components that may implement certain of the steps described above via computer-readable media having stored computer-executable instructions or data structures recorded thereon that can be accessed, read and executed by one or more processors for controlling the disclosed energy/light scattering layer forming and vehicle integration schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, computer-aided design (CAD) or computer-aided manufacturing (CAM) of particular objects, object structures, layers, and/or layer components.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of method steps represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 7, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

We claim:

1. A method for providing a selectively colorable system that produces electrical energy for charging an electrical power storage device in an electrically powered vehicle in the presence of light, comprising:
    arranging an energy harvesting element on a surface of a vehicle body; and
    forming an energy transmissive layer over the energy harvesting element on the surface of the vehicle body;
        the energy transmissive layer having a body-facing side facing the surface of the vehicle body, and an energy-incident side opposite the body-facing side, the energy-incident side presenting a consistent opaque appearance when viewed from any aspect, and the energy transmissive layer passing 50% or more of light energy impinging on the energy transmissive layer through the energy transmissive layer to activate the energy harvesting element, and
        the energy transmissive layer being formed of a material composition comprising a plurality of substantially-transparent particles and a substantially-transparent matrix material that fixes the plurality of substantially-transparent particles in a layer arrangement;
    forming each of the plurality of substantially-transparent particles of
        a spherical core formed of a first transparent dielectric material, the spherical core having a value of a physical diameter equal to a half wavelength of a first selected color of light component to be reflected by the particle modified by a refractive index of the first transparent dielectric material;
        a plurality of material layers disposed radially outwardly from the spherical core, each of the plurality of material layers being formed of at least a second transparent dielectric material, and having a value of a physical thickness equal to a quarter wavelength of at least a second selected color of light component to be reflected by the particle modified by a refractive index of the at least the second transparent dielectric material; and
        an outer coating comprised of another transparent dielectric material having a selected index of refraction of 2 or less, the outer coating having a thickness that substantially eliminates reflective interference between the colors reflected by adjacent particles when in contact with one another; and
        connecting an electrical output of said energy harvesting element to an electrical power storage device in the vehicle.

2. The method of claim 1, further comprising fixing the plurality of substantially-transparent particles in the matrix material in a manner that causes the energy-incident side to reflect one or more selectable wavelengths of the impinging light energy in all directions on the energy-incident side to present the consistent opaque appearance.

3. The method of claim 1, further comprising adjusting an index of refraction of the substantially transparent matrix material to be a same index of refraction as the outer coating.

4. The method of claim 1, the energy harvesting element comprising a photovoltaic element.

5. The method of claim 4, the photovoltaic element being a photovoltaic film (PVF) material.

6. The method of claim 5, further comprising applying the PVF material to one or more first discrete portions of the surface of the vehicle body.

7. The method of claim 6, further comprising applying a layer of adhesive to the one or more first discrete portions of the surface of the vehicle body before applying the PVF material to the one or more first discrete portions, the layer of adhesive affixing the PVF material to the surface of the vehicle body in the one or more first discrete portions.

8. The method of claim 6, further comprising applying a surface treatment to at least second portions of the surface of the vehicle body,
    the second portions of the surface of the vehicle body being different portions than the first portions, and
    the surface treatment rendering an optical reflectance of the second portions substantially equal to an optical reflectance of the PVF material in the first portions.

9. The method of claim 1, the forming the energy transmissive layer over the energy harvesting element on the surface of the vehicle body structure comprising:
    delivering the material composition in a liquid form; and
    applying one of heat or light energy to fix the material composition to form the energy transmissive layer.

10. The method of claim 9, each of the substantially-transparent particles having a diameter in a range of 5 microns or less.

11. The method of claim 10, each of the substantially-transparent particles having a diameter in a range of 1.0 to 3.0 microns.

12. The method of claim 11, the delivering the material composition in a liquid form comprising:
    entraining the material composition in an air stream; and
    spraying the entrained material composition on the surface of the vehicle body.

13. The method of claim 12, further comprising separately entraining the plurality of substantially-transparent particles and the substantially-transparent matrix material in the air stream to form the material composition sprayed on the surface of the vehicle body.

14. The method of claim 1, further comprising establishing an electrical connection from the energy harvesting element to at least one of an electrical energy power source, or an electrically powered component device in the vehicle for transmitting electrical energy generated by the electrical harvesting element.

15. The method of claim 14, the electrical connection comprising at least one of an electrical energy converting circuit or an electrical energy conditioning circuit.

16. The method of claim 1, further comprising arranging a transparent protective coating over the energy transmissive layer.

17. The method of claim 1, the energy transmissive layer being arranged to pass 80% or more of light energy impinging on the energy transmissive layer through the energy transmissive layer to activate the energy harvesting element.

18. The method of claim 1, the energy harvesting element being arranged on a surface of the vehicle body by being at least partially accommodated in a cavity in the surface of the vehicle body.

19. The method of claim 1, wherein said electrical power storage device comprises a battery.

20. The method of claim 1, wherein said energy harvesting element comprises a thin film photovoltaic material layer.

* * * * *